United States Patent
Kurahashi et al.

(10) Patent No.: US 8,723,624 B2
(45) Date of Patent: May 13, 2014

(54) ELASTIC WAVE DEVICE HAVING AN INSULATING FILM WITH WIRING THEREON NOT ARRANGED OVER THE IDT ELECTRODES

(75) Inventors: Kenta Kurahashi, Ishikawa-gun (JP); Motoji Tsuda, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 542 days.

(21) Appl. No.: 13/027,476

(22) Filed: Feb. 15, 2011

(65) Prior Publication Data

US 2011/0140808 A1      Jun. 16, 2011

Related U.S. Application Data

(63) Continuation of application No. PCT/JP2009/002143, filed on May 15, 2009.

(30) Foreign Application Priority Data

Sep. 9, 2008  (JP) .................................. 2008-231092

(51) Int. Cl.
    *H03H 9/64*      (2006.01)
(52) U.S. Cl.
    USPC .................... 333/193; 310/313 B; 333/195
(58) Field of Classification Search
    USPC ................... 333/193–196, 150, 151, 133; 310/313 B, 313 D
    See application file for complete search history.

(56) References Cited

U.S. PATENT DOCUMENTS

| | | | |
|---|---|---|---|
| 7,583,161 B2 * | 9/2009 | Tanaka | 333/133 |
| 8,013,692 B2 * | 9/2011 | Haruta | 333/193 |
| 2003/0107454 A1 | 6/2003 | Nakamura et al. | |
| 2004/0145278 A1 * | 7/2004 | Iwamoto | 310/348 |
| 2005/0057323 A1 | 3/2005 | Kando | |
| 2006/0192462 A1 * | 8/2006 | Iwamoto et al. | 310/348 |
| 2008/0246552 A1 | 10/2008 | Shibahara et al. | |

FOREIGN PATENT DOCUMENTS

| | | |
|---|---|---|
| EP | 1 315 297 A2 | 5/2003 |
| EP | 1 701 441 A1 | 9/2009 |
| JP | 2003-204243 A | 7/2003 |
| JP | 2004-159262 A | 6/2004 |
| JP | 2007-28195 A | 2/2007 |
| WO | 2006/067884 A1 | 6/2006 |
| WO | WO 2007/083432 A1 * | 7/2007 |
| WO | 2008/038498 A1 | 4/2008 |
| WO | 2007/055080 A1 | 5/2008 |

OTHER PUBLICATIONS

Official Communication issued in International Patent Application No. PCT/JP2009/002143, mailed on Aug. 11, 2009.

* cited by examiner

*Primary Examiner* — Barbara Summons
(74) *Attorney, Agent, or Firm* — Keating & Bennett, LLP

(57) ABSTRACT

An elastic wave device that suppresses high-frequency spurious components caused by unwanted waves, such as bulk waves, and improves filter characteristics, includes a piezoelectric substrate, an electrode structure including an IDT electrode provided on the substrate, a first wiring portion that is electrically connected to the IDT electrode, and a second wiring portion provided on a first insulating film that includes a through-hole partially exposing the first wiring portion therethrough. The second wiring portion extends into the through-hole and is electrically connected to the first wiring portion. The second wiring portion is arranged over an area other than the area in which the IDT electrode is disposed.

4 Claims, 9 Drawing Sheets

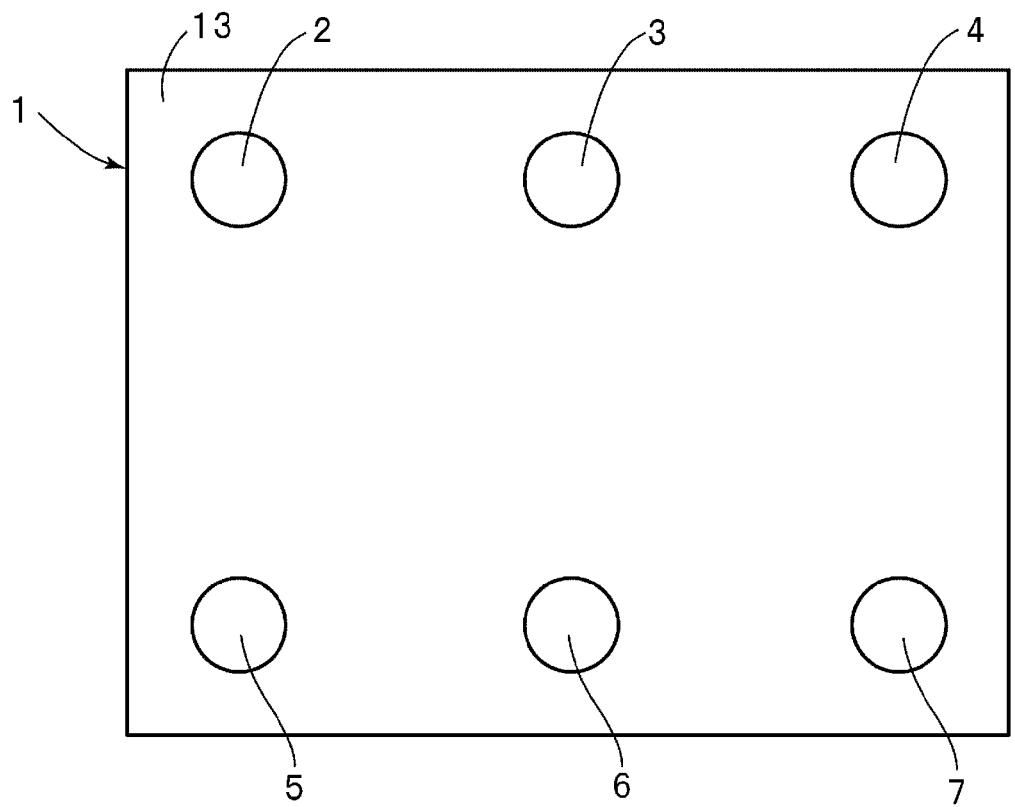

US 8,723,624 B2

ELASTIC WAVE DEVICE HAVING AN INSULATING FILM WITH WIRING THEREON NOT ARRANGED OVER THE IDT ELECTRODES

BACKGROUND OF THE INVENTION

1. Field of the Invention

The present invention relates to elastic wave devices, such as elastic boundary wave devices and surface acoustic wave devices, and in particular, relates to elastic wave devices including first wiring portions that are electrically connected to IDT electrodes and that are electrically connected to second wiring portions disposed on insulating films.

2. Description of the Related Art

Surface acoustic wave devices and elastic boundary wave devices have been used for, for example, band-pass filters of cellular phones. In order to reduce the size of electronic devices, these elastic boundary wave devices need to be mountable on circuit boards by flip-chip bonding using metal bumps.

For example, Japanese Unexamined Patent Application Publication No. 2007-28195 discloses an elastic boundary wave device including solder bumps mountable on circuit boards by flip-chip bonding. FIG. 12 is a fragmentary sectional view of the elastic boundary wave device described in Japanese Unexamined Patent Application Publication No. 2007-28195. An elastic boundary wave device 1001 includes a piezoelectric substrate 1002. A dielectric layer 1003 is laminated on the piezoelectric substrate 1002. An electrode 1004 including an IDT electrode is disposed between the piezoelectric substrate 1002 and the dielectric layer 1003. Although the IDT electrode is not illustrated, an electrode pad 1004a that is electrically connected to the IDT electrode is illustrated.

Moreover, a sound absorbing film 1005 arranged to absorb leaking elastic waves or bulk waves is laminated on the upper surface of the dielectric layer 1003.

A first wiring portion 1006 is provided on the piezoelectric substrate 1002 so as to be electrically connected to the electrode pad 1004a. The dielectric layer 1003 includes a through-hole 1003a, and the first wiring portion 1006 is partially exposed through the through-hole 1003a. Furthermore, a second wiring portion 1007 is provided on the dielectric layer 1003. A portion 1007a of the second wiring portion 1007 extends into the through-hole 1003a, and the second wiring portion 1007 is electrically connected to the first wiring portion 1006. Moreover, a through-hole 1005a is provided in the sound absorbing film 1005 so as to communicate with the through-hole 1003a. An under-bump metal layer 1008 is disposed in an opening defined by the through-holes 1003a and 1005a, and a solder bump 1009 is disposed on the under-bump metal layer 1008. This solder bump 1009 is connected to an electrode land on a circuit board.

The second wiring portion 1007 is also electrically connected to, for example, other first wiring portions provided on other portions of the elastic boundary wave device 1001. Therefore, the second wiring portion 1007 is routed on the upper surface of the dielectric layer 1003 so as to electrically connect a plurality of portions.

On the other hand, a reduction in size of the elastic boundary wave device 1001 has been highly desirable. Accordingly, the second wiring portion 1007 is routed so as to electrically connect portions to be connected to each other with the shortest possible length. Therefore, IDT electrodes, for example, are arranged under the second wiring portion 1007 at some locations.

The elastic boundary wave device 1001 described in Japanese Unexamined Patent Application Publication No. 2007-28195 can be reduced in size since the second wiring portion 1007 is routed so as to electrically connect the portions to be connected to each other with the shortest possible length. However, the device disadvantageously has poor electrical characteristics, for example, low filter characteristics, since relatively intense high-frequency spurious components caused by unwanted waves such as bulk waves occur in the device.

SUMMARY OF THE INVENTION

To overcome the problems described above, preferred embodiments of the present invention provide an elastic wave device in which high-frequency spurious components caused by unwanted waves, such as bulk waves, are minimized or prevented in the elastic wave device so as to obtain excellent filter characteristics.

A first preferred embodiment of the present invention provides an elastic wave device including a piezoelectric substrate, at least one IDT electrode provided on the piezoelectric substrate, a first wiring portion provided on the piezoelectric substrate and electrically connected to the at least one IDT electrode, an insulating film arranged so as to cover the at least one IDT electrode and the first wiring portion and including at least one through-hole arranged so as to partially expose the first wiring portion therethrough, and a second wiring portion arranged on the insulating film so as to extend into the at least one through-hole of the insulating film and be electrically connected to the first wiring portion inside the at least one through-holes. The second wiring portion is preferably arranged over an area other than the area in which the at least one IDT electrode is disposed.

A second preferred embodiment of the present invention provides an elastic wave device including a piezoelectric substrate, at least one IDT electrode provided on the piezoelectric substrate, a first wiring portion electrically connected to the at least one IDT electrode and provided on the piezoelectric substrate, an insulating film arranged so as to cover the at least one IDT electrode and the first wiring portion and including at least one through-hole arranged so as to partially expose the first wiring portion therethrough, and a second wiring portion arranged on the insulating film so as to extend into the at least one through-hole of the insulating film and be electrically connected to the first wiring portion inside the at least one through-holes. The second wiring portion is preferably arranged over an area other than the area in which an electrode finger interdigitated portion of the at least one IDT electrode is disposed.

According to a preferred embodiment of the present invention, the elastic wave device is preferably an elastic boundary wave device using elastic boundary waves that propagate through the interface between the piezoelectric substrate and the insulating film. However, the device may also preferably be defined by a surface acoustic wave device using surface acoustic waves.

In the elastic wave device according to the first preferred embodiment of the present invention, the second wiring portion is preferably arranged over an area other than the area in which the at least one IDT electrode is disposed. This prevents high-frequency spurious components caused by unwanted waves, such as bulk waves, from being generated. As a result, electrical characteristics, such as filter characteristics, are significantly improved.

Similarly, according to the second preferred embodiment of the present invention, the second wiring portion is arranged over an area other than the area in which the electrode finger interdigitated portion of the at least one IDT electrode is disposed. This also prevents high-frequency spurious components caused by unwanted waves, such as bulk waves, from being generated. As a result, electrical characteristics, such as filter characteristics, are significantly improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a plan view of the elastic wave device according to the first preferred embodiment of the present invention in which an underlying electrical structure is not illustrated.

DETAILED DESCRIPTION OF THE PREFERRED EMBODIMENTS

Preferred embodiments of the present invention will now be described with reference to the drawings so as to clarify the present invention.

Figure 1A:
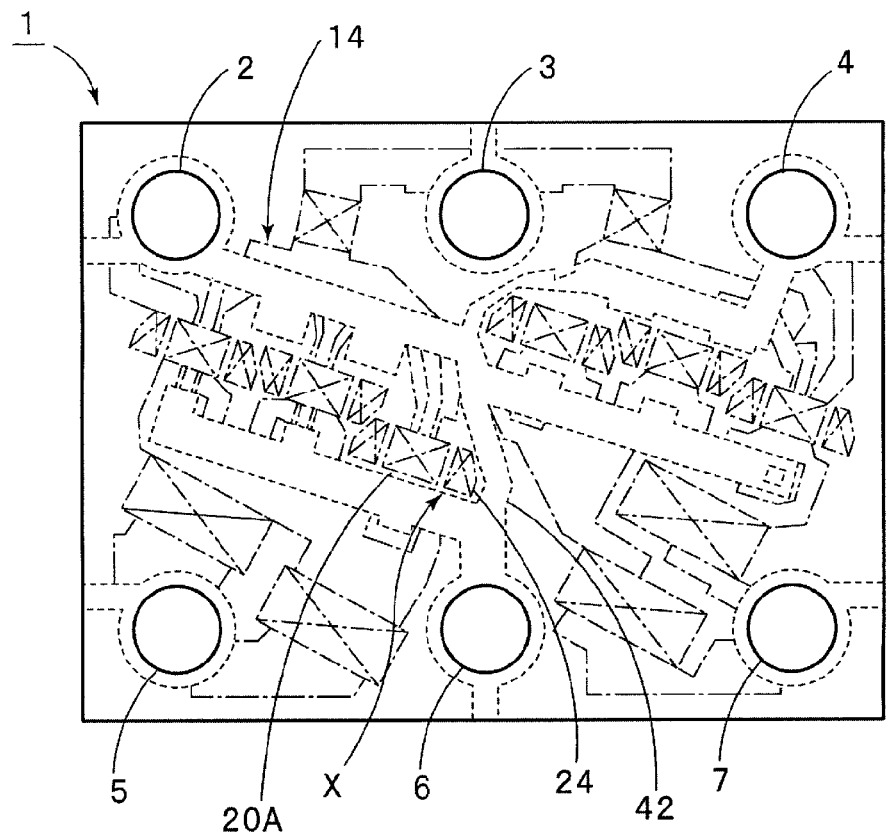
FIG. 1A is a plan view of an elastic wave device according to a first preferred embodiment of the present invention.
Figure 1B:
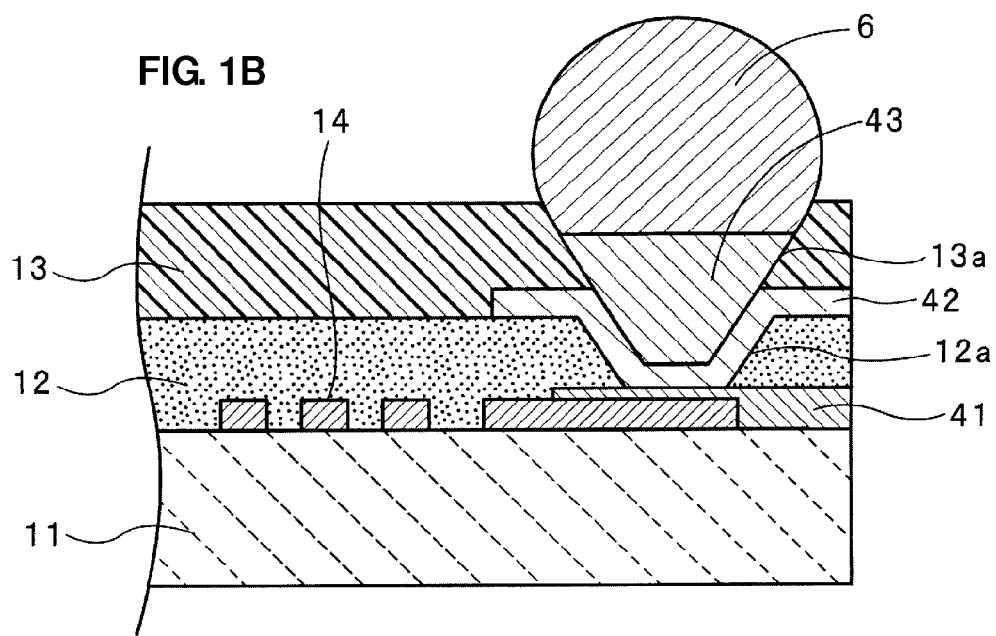
FIG. 1B is a partially enlarged sectional view of a primary portion of the device.

FIG. 1A is a plan view of an elastic wave device according to a first preferred embodiment of the present invention, and FIG. 1B is a partially enlarged sectional view of a primary portion of the device. As shown in FIG. 1A, an elastic wave device 1 preferably has a rectangular planar shape, and includes a plurality of metal bumps 2 to 7 on the upper surface thereof. The elastic wave device 1 is preferably mounted on a surface of a circuit board using the metal bumps 2 to 7. That is, preferably, the elastic wave device 1 is turned upside down, and is connected to electrode lands on the circuit board at the side of the device on which the metal bumps 2 to 7 are disposed.

As shown in FIG. 1B, the elastic wave device 1 includes a piezoelectric substrate 11, a first insulating film 12 provided on the piezoelectric substrate 11, and a second insulating film 13 provided on the first insulating film 12. In this preferred embodiment, the device 1 is preferably defined by an elastic boundary wave device using elastic boundary waves that propagate through the interface between the piezoelectric substrate 11 and the first insulating film 12.

The piezoelectric substrate 11 is preferably made of $LiNbO_3$, for example, in this preferred embodiment. The piezoelectric substrate 11 may be made of other piezoelectric single crystals, such as $LiTaO_3$ or quartz crystal, instead of $LiNbO_3$, or can be made of piezoelectric ceramics, for example.

The first insulating film 12 is preferably made of $SiO_2$, for example, in this preferred embodiment. However, the first insulating film 12 may be made of other insulating materials, such as SiN, for example. Moreover, the first insulating film 12 may be formed by laminating a plurality of insulating films. For example, the first insulating film 12 may be formed by laminating a SiN film on a $SiO_2$ film.

The second insulating film 13 preferably functions as a sound absorbing film that absorbs elastic waves or bulk waves leaking upward in this preferred embodiment. The second insulating film 13 may be made of any insulating materials as long as the film 13 has a sound absorbing effect. In this preferred embodiment, the second insulating film 13 is preferably made of polyimide, for example. However, the film 13 can be made of other organic insulating materials, such as epoxy resin, for example. Moreover, the second insulating film 13 may be made of inorganic insulating materials, for example.

An electrode structure 14 including at least one IDT electrode is preferably provided on the upper surface of the piezoelectric substrate 11. This electrode structure 14 defines a plurality of elastic wave elements on the piezoelectric substrate 11. In FIG. 1A, the electrode structure 14 is indicated by alternate long and short dash lines. A portion indicated by broken lines in FIG. 1A corresponds to a second wiring portion provided on the upper surface of the first insulating film 12 (described below). The electrode structure in the elastic wave device 1 will now be described in detail with reference to FIGS. 2 to 5.

Figure 3:
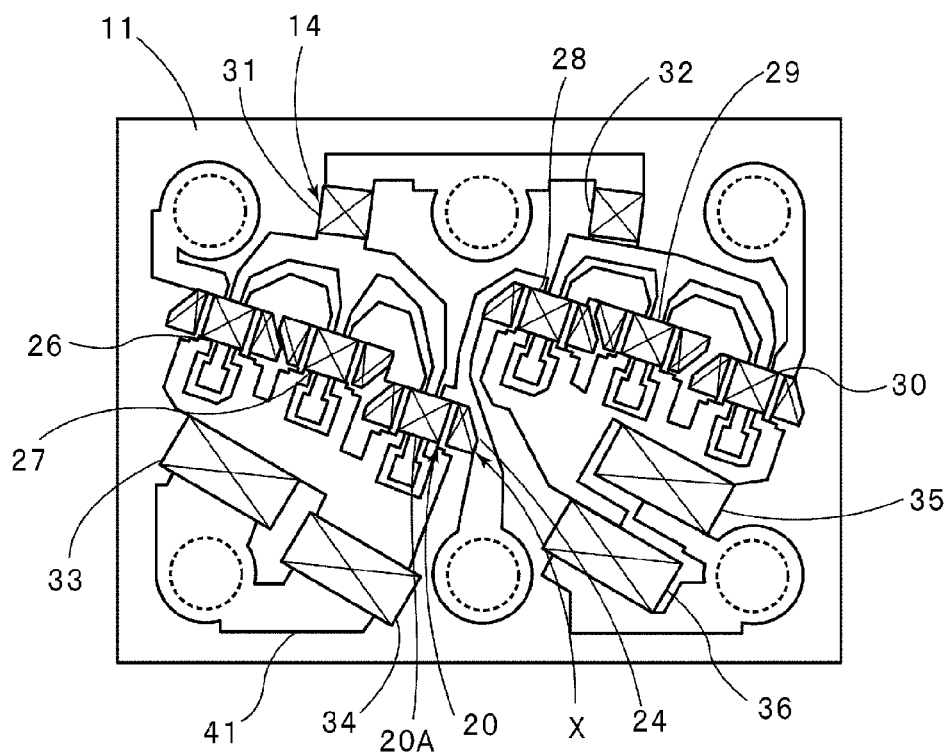
FIG. 3 is a schematic plan view illustrating a state in which a first insulating film and a second insulating film are removed in the elastic wave device according to the first preferred embodiment of the present invention.

FIG. 3 is a schematic plan view illustrating the piezoelectric substrate 11 and the electrode structure 14 provided on the piezoelectric substrate 11. In FIG. 3, the first insulating film 12 and the second insulating film 13 disposed on the piezoelectric substrate 11 and the electrode structure 14 are removed. In FIG. 3, locations at which the metal bumps 2 to 7 are provided are shown by broken-line circles.

Figure 2:
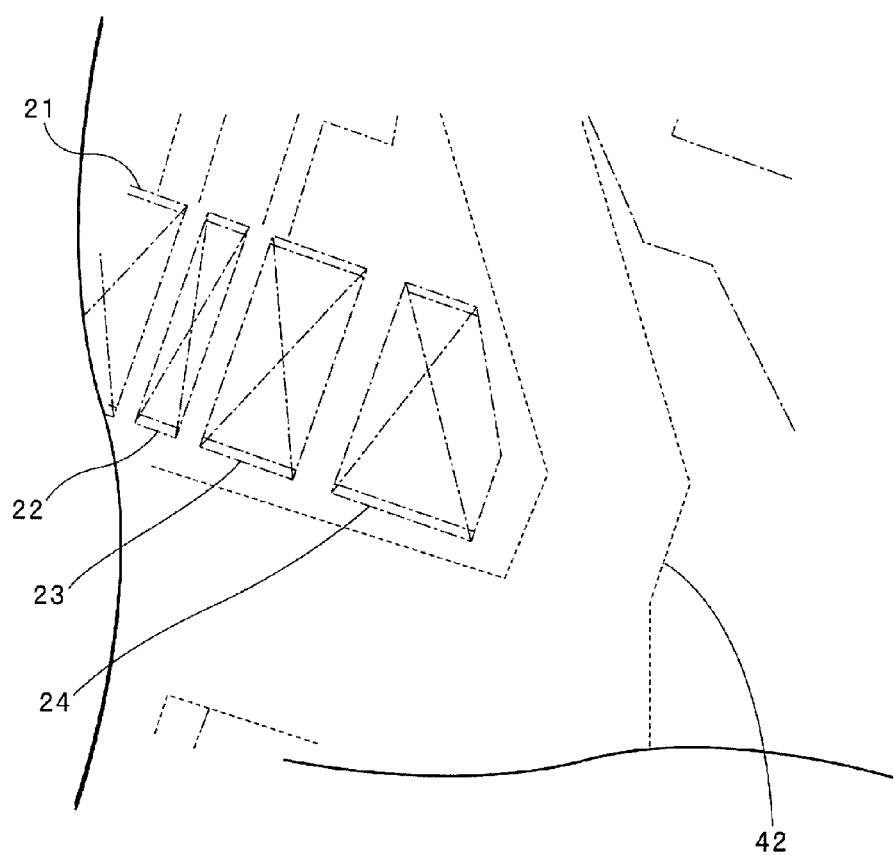
FIG. 2 is a schematic partial plan view illustrating the primary portion of the elastic wave device according to the first preferred embodiment of the present invention.

In FIG. 3, portions at which IDT electrodes and grating reflectors are provided are schematically shown by a symbol X added in an outer shape of rectangles and trapezoids. FIG. 2 is an enlarged view of one of the portions at which IDT electrodes and grating reflectors are provided. FIG. 2 is an enlarged view of a portion indicated by arrows X shown in FIGS. 1A and 3 and the periphery thereof, and illustrates three IDT electrodes 21 to 23 and a reflector 24 at a side of the IDT electrode 23. Another grating reflector is disposed on a side of the IDT electrode 21 opposite to that on which the reflector 24 is disposed. With this, a three-IDT elastic wave filter 20 of the longitudinally coupled resonator type is provided.

Since the drawings are complicated when the three IDT electrodes 21 to 23 of this elastic wave filter 20 are illustrated, the three IDT electrodes 21 to 23 are collectively shown as an IDT electrode portion 20A in FIGS. 1A and 3.

As shown in FIG. 3, five three-IDT elastic wave filters 26 to 30 of the longitudinally coupled resonator type are preferably provided in addition to the elastic wave filter 20, for example. Moreover, one-port elastic wave resonators 31 to 36 are preferably disposed at locations separated from the elastic wave filter 20, 26 to 30.

The elastic wave filters 20, 26 to 30 and the elastic wave resonators 31 to 36 preferably define a filter device having a balanced-to-unbalanced conversion function in the elastic wave device 1 according to this preferred embodiment. In order to electrically connect the elastic wave filters 20, 26 to 30 and the elastic wave resonators 31 to 36 in the electrode structure 14, a first wiring portion 41 is provided on the piezoelectric substrate 11 as shown in FIG. 3. In FIG. 1A, the first wiring portion 41 is indicated by alternate long and short dash lines, and the electrode structure 14 is similarly indicated.

The above-described IDT electrodes and the grating reflectors are preferably made of, for example, Au, Pt, Al, Ni, Cu, or alloys that are primarily made of these metals. The IDT electrodes and the grating reflectors may be defined by laminated metallic films preferably formed by laminating a plurality of metallic films, for example. In this preferred embodiment, the IDT electrodes and the reflectors are preferably made of Au and Pt, for example.

The first wiring portion 41 is preferably made of an appropriate metallic material, such as Pt, Al, Cu, or an alloy that is primarily made of these metals, for example. The first wiring portion 41 may be made of the same material as the IDT electrodes. In this case, the IDT electrodes and the first wiring portion 41 may preferably be formed on the piezoelectric substrate 11 during the same process in one step.

The first wiring portion 41 may preferably be made of Al or Cu, for example, which are inexpensive so as to reduce cost, or may preferably be made of metals with high conductivity that is suitable for the first wiring portion 41. The first wiring portion 41 can also be defined by a laminated metallic film preferably formed by laminating a plurality of metallic films, for example. In this preferred embodiment, the first wiring portion 41 is preferably made of Pt and Al, for example.

As shown in FIG. 1B, the electrode structure 14 including the IDT electrodes 21 to 23 is partially connected to the first wiring portion 41. The first wiring portion 41 is laminated on the upper surface of the electrode structure 14 so as to be electrically connected to the electrode structure 14. The first wiring portion 41 may preferably be laminated on portions of the upper surface of the electrode structure 14 by forming the first wiring portion 41 after the formation of the electrode structure 14 including the IDT electrodes 21 to 23.

Figure 4:
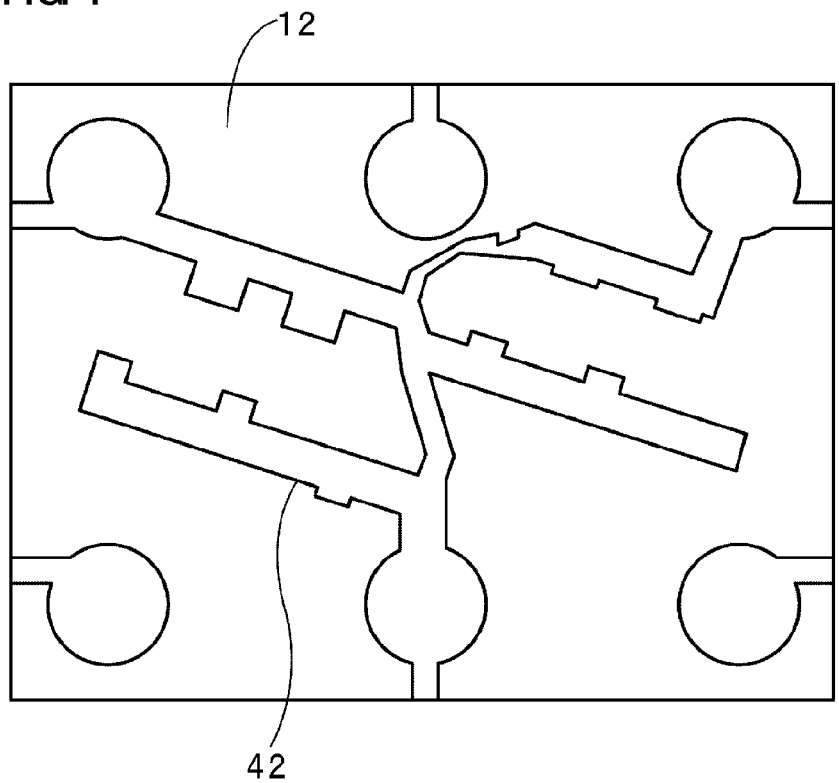
FIG. 4 is a schematic plan view illustrating a state in which the second insulating film is removed in the elastic wave device according to the first preferred embodiment of the present invention.

Subsequently, as shown in FIG. 1B, through-holes 12a and 13a passing through the first insulating film 12 and the second insulating film 13, respectively, are preferably provided in the films. The through-holes 12a are preferably arranged such that the first wiring portion 41 is partially exposed therethrough. Moreover, a second wiring portion 42 is arranged so as to extend into the through-holes 12a. The second wiring portion 42 is provided on the first insulating film 12, and preferably has a planar or substantially planar shape indicated by broken lines in FIG. 1A. FIG. 4 is a plan view of the second wiring portion 42 on the first insulating film 12. In FIG. 4, the second insulating film 13 disposed on the first insulating film 12 and on the second wiring portion 42 is removed.

The second wiring portion 42 is preferably made of an appropriate metallic material, such as Pt, Al, Cu, or an alloy that is primarily made of these metals, for example. The second wiring portion 42 may be made of the same metallic material as that of the first wiring portion 41, or may be made of a different metallic material. The second wiring portion 42 may also be defined by a laminated metallic film formed by laminating a plurality of metallic films.

The second wiring portion 42 is preferably arranged on the first insulating film 12 so as to extend into the through-holes provided in the first insulating film 12 at the locations of the metal bumps 2 to 7. As shown in FIG. 1B, which typically illustrates the portion at which the metal bump 6 is provided, the second wiring portion 42 extends into the through-holes 12a, and is laminated on the upper surface of the first wiring portion 41 exposed through the through-holes 12a. With this arrangement, the first and second wiring portions 41 and 42 are electrically connected to each other.

The elastic wave filters 20, 26 to 30, the elastic wave resonators 31 to 36, and other elements provided on the piezoelectric substrate 11 can be electrically connected more densely using the second wiring portion 42. That is, highly dense wiring can be achieved using the first wiring portion 41 on the piezoelectric substrate 11 and the second wiring portion 42 on the first insulating film 12 without increasing the planar area of the elastic wave device 1. Therefore, the size of the elastic wave device 1 can be effectively reduced.

As shown in FIG. 1B, under-bump metal layers 43 are preferably disposed in the through-holes 12a so as also to extend into the through-holes 13a. The under-bump metal layers 43 may preferably be formed by electrolytic plating or electroless plating using, for example, Au, Ni, or Cu.

Although the metallic material used for these under-bump metal layers 43 is not specifically limited, a metal with an excellent bondability to the metallic material of the metal bumps 2 to 7 (described below) is preferably used.

The metal bumps 2 to 7 are preferably disposed on the under-bump metal layers 43. FIG. 5 is a plan view of the elastic wave device 1 illustrating the locations at which the metal bumps 2 to 7 are disposed. The metal bumps 2 to 7 in this preferred embodiment are preferably made of solder, for example. However, the metal bumps 2 to 7 may be made of other metals, such as Au or Ag, or an alloy, for example.

In the elastic wave device 1 according to this preferred embodiment, the IDT electrodes of the elastic wave filters 20, 26 to 30 or those of the one port elastic wave resonators 31 to 36 are preferably not located under the second wiring portion 42 provided on the first insulating film 12. This prevents high-frequency spurious components caused by unwanted waves, such as bulk waves, from being generated, which results in excellent resonance characteristics and filter characteristics.

Figure 12:
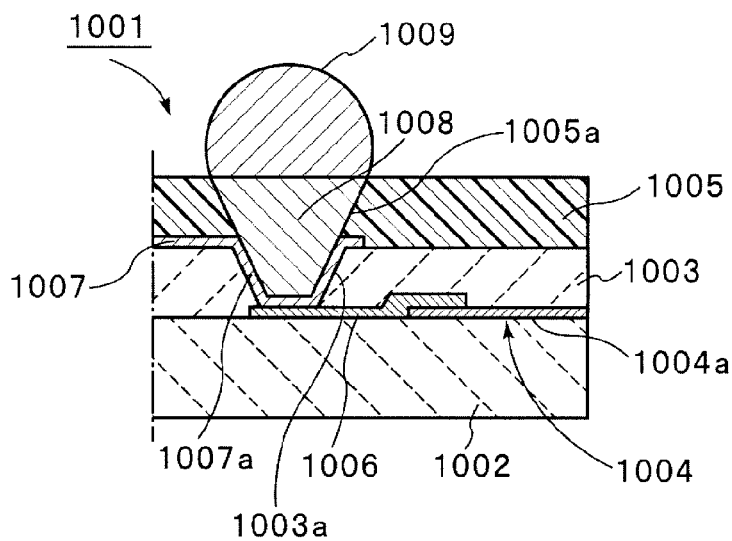
FIG. 12 is a fragmentary sectional view of a known elastic wave device.

As a result of studies on the problems of high-frequency spurious components caused by unwanted waves, such as bulk waves, in the known elastic wave device shown in FIG. 12, the inventors discovered that unwanted waves, such as bulk waves, were markedly excited when the second wiring portion 1007, which enables high-density wiring, overlapped with the underlying IDT electrodes, and that undesired spurious frequency components occurred. Preferred embodiments of the present invention were developed based on the discovery that the second wiring portion provided on the first insulating film can be arranged so as not to overlap with the IDT electrodes with the first insulating film therebetween in order to minimize or prevent the excitation of the unwanted waves, such as bulk waves.

In the elastic wave device 1 according to the present preferred embodiment, the IDT electrodes of the elastic wave filters 20, 26 to 30 and those of the one port elastic wave resonators 31 to 36 are not located under the second wiring portion 42 provided on the first insulating film 12. With this arrangement, excitation of unwanted waves, such as bulk waves, is minimized or prevented, which results in excellent resonance characteristics and filter characteristics.

This will be described on the basis of specific experimental examples.

Figure 6A:
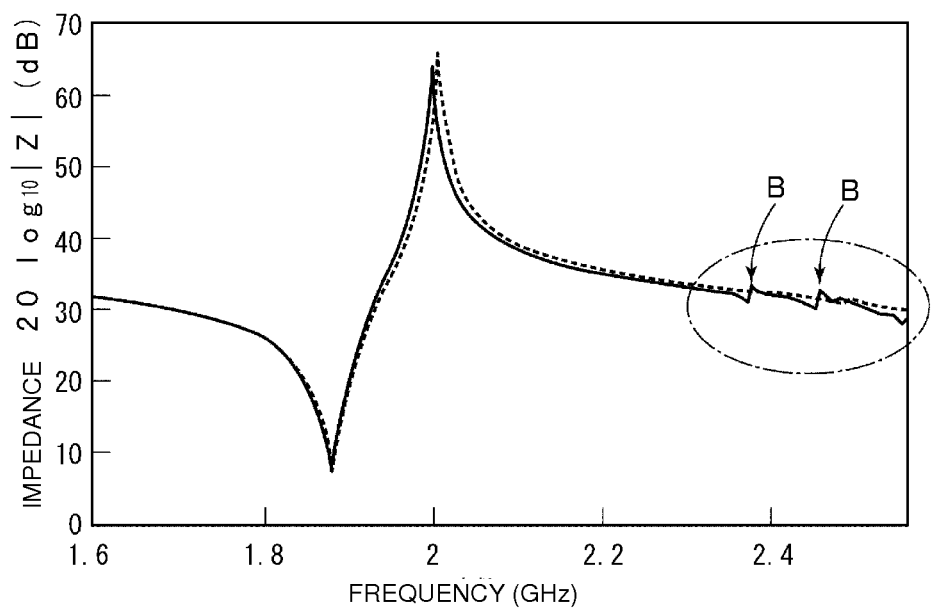
FIGS. 6A and 6B illustrate the impedance-frequency characteristic of an elastic wave resonator in the elastic wave device according to the first preferred embodiment of the present invention and that of an elastic wave resonator in an elastic wave device according to a comparative example.
Figure 6B:
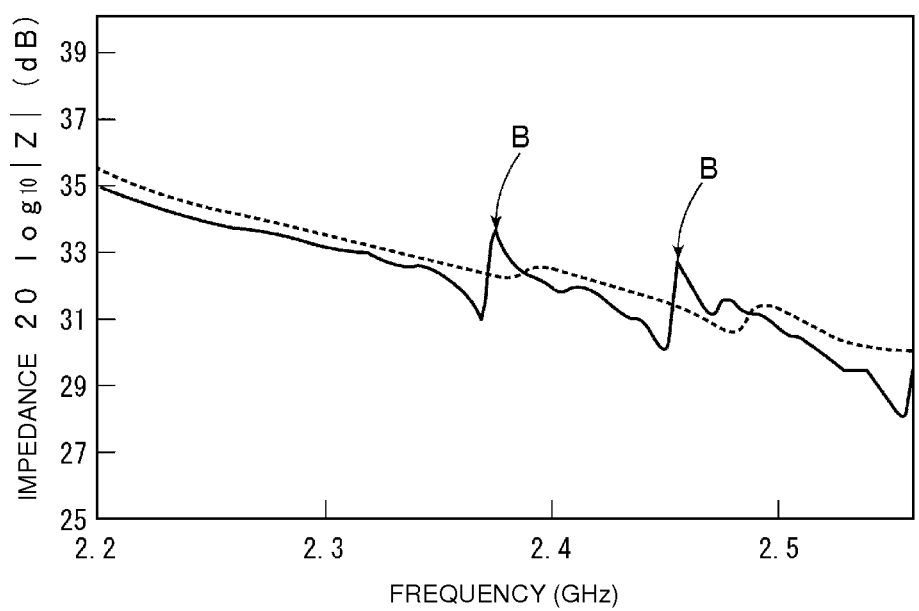
Figure 7A:
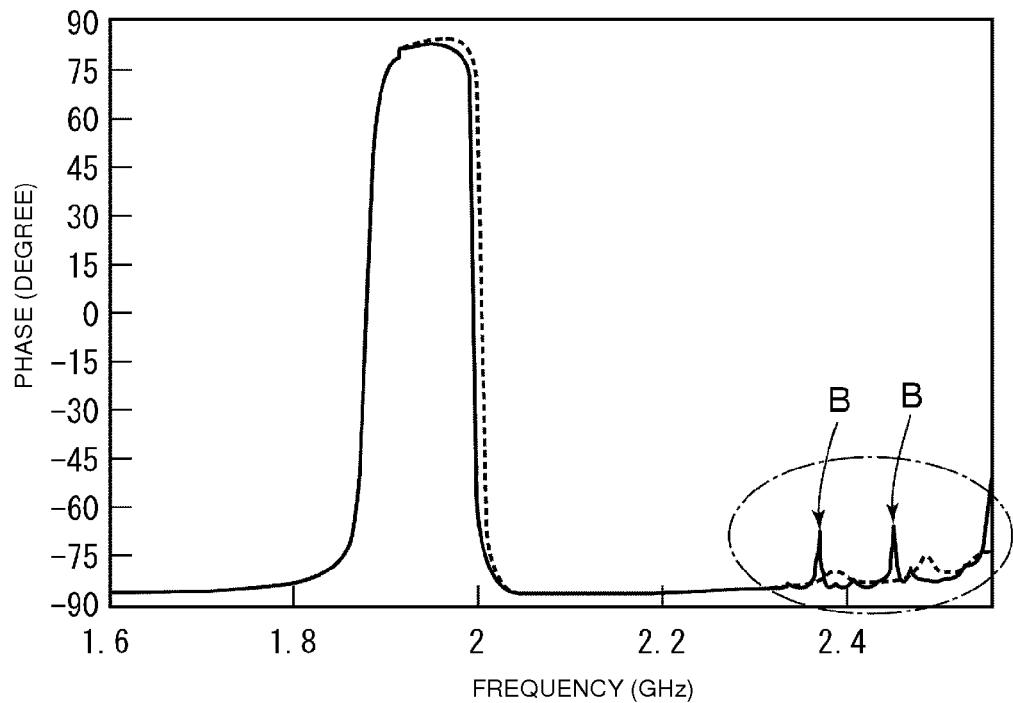
FIGS. 7A and 7B illustrate the phase-frequency characteristics of the elastic wave resonators in the elastic wave devices according to the first preferred embodiment of the present invention and the comparative example.
Figure 7B:
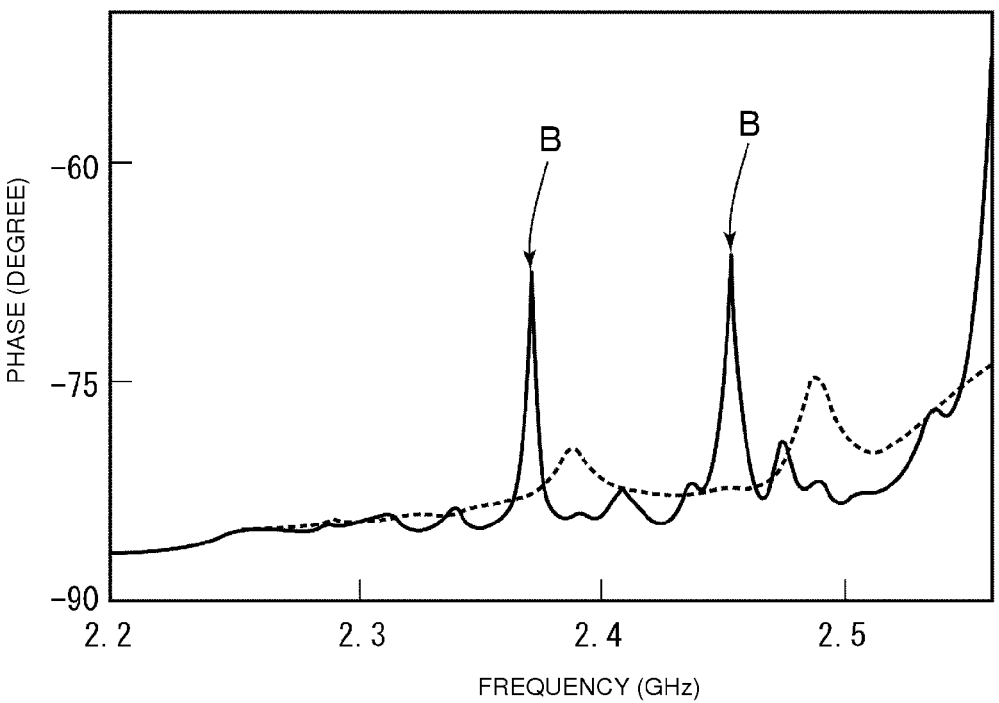
Figure 8A:
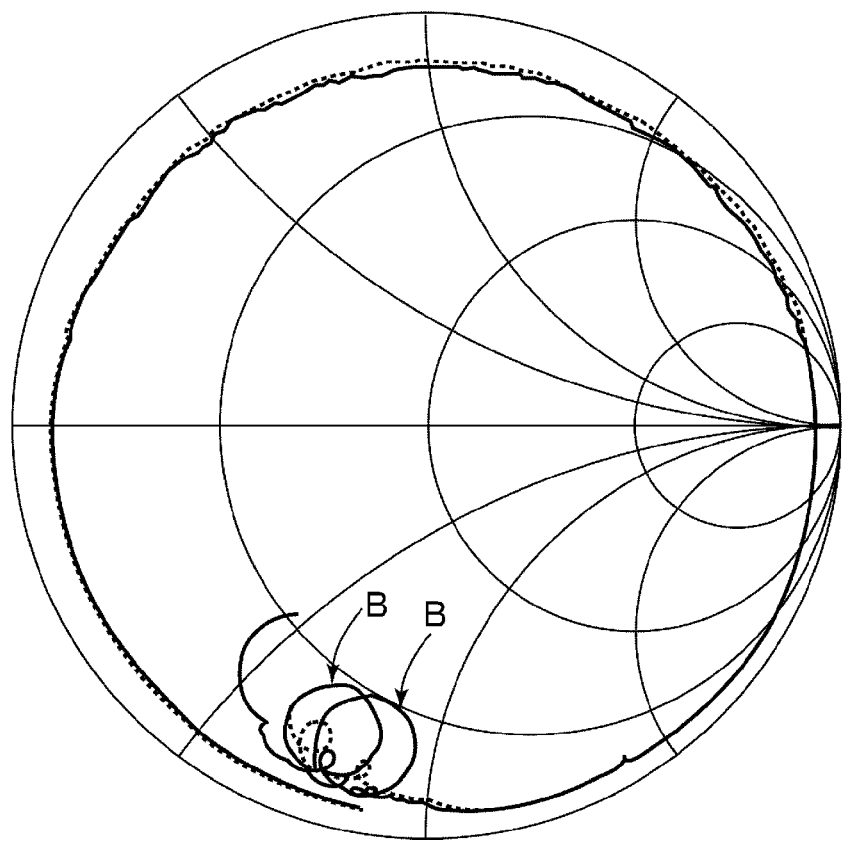
FIGS. 8A and 8B are Smith charts indicating the impedances of the elastic wave resonators in the elastic wave devices according to the first preferred embodiment of the present invention and the comparative example.
Figure 8B:
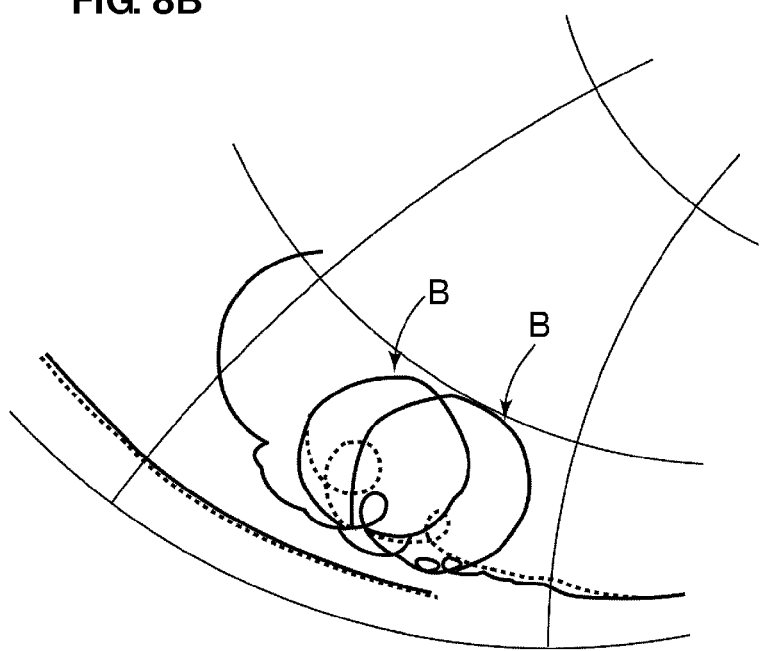

The resonance characteristics of the elastic wave resonator 31 provided on the piezoelectric substrate 11 were measured. The resonance characteristics of a comparative example in which the second wiring portion 42 partially overlapped with the elastic wave resonator 31 were measured for comparison. FIGS. 6A to 8B illustrate the results. FIGS. 6A and 6B illustrate the impedance-frequency characteristics of the elastic wave resonator, FIGS. 7A and 7B illustrate the phase-frequency characteristics, and FIGS. 8A and 8B are Smith charts indicating the impedances. In FIGS. 6A to 8B, the results of the comparative example are indicated by solid lines, and those of the present preferred embodiment are indicated by broken lines.

The characteristics shown in FIGS. 6A to 8B were results obtained when the elastic wave resonator 31 provided on the piezoelectric substrate 11 was manufactured with the following specifications.

The number of electrode finger pairs in the IDT electrode was 60, the pitch of the electrode fingers was about 0.8 μm (wavelength λ (determined by the electrode finger pitch)= about 1.6 μm), the duty ratio was about 0.5, and the number of electrode fingers in the reflector was 40.

The IDT electrode was of the non-normal type.

Moreover, the second wiring portion 42 overlapped with 100% of an electrode finger interdigitated portion of the IDT electrode in the elastic wave resonator 31 in the comparative example. According to this preferred embodiment, the second wiring portion 42 was not located over the electrode finger interdigitated portion of the IDT electrode in the elastic wave resonator 31. Herein, the electrode finger interdigitated portion refers to an area in which the electrode fingers defining the IDT electrode are interposed between each other.

As shown in FIGS. 6A to 8B, significant high-frequency spurious components caused by unwanted waves, such as bulk waves, indicated by arrows B occurred in the comparative example indicated by the solid lines. In contrast, no significant high-frequency spurious components caused by unwanted waves, such as bulk waves, occurred in this preferred embodiment as indicated by the broken lines.

Although the plurality of elastic wave filters 20, 26 to 30 and the plurality of elastic wave resonators 31 to 36 were preferably provided in the first preferred embodiment, the shape of the electrode structure 14 provided on the piezoelectric substrate 11 according to preferred embodiments of the present invention can be modified as appropriate in accordance with the intended function of the elastic wave device.

Figure 9:
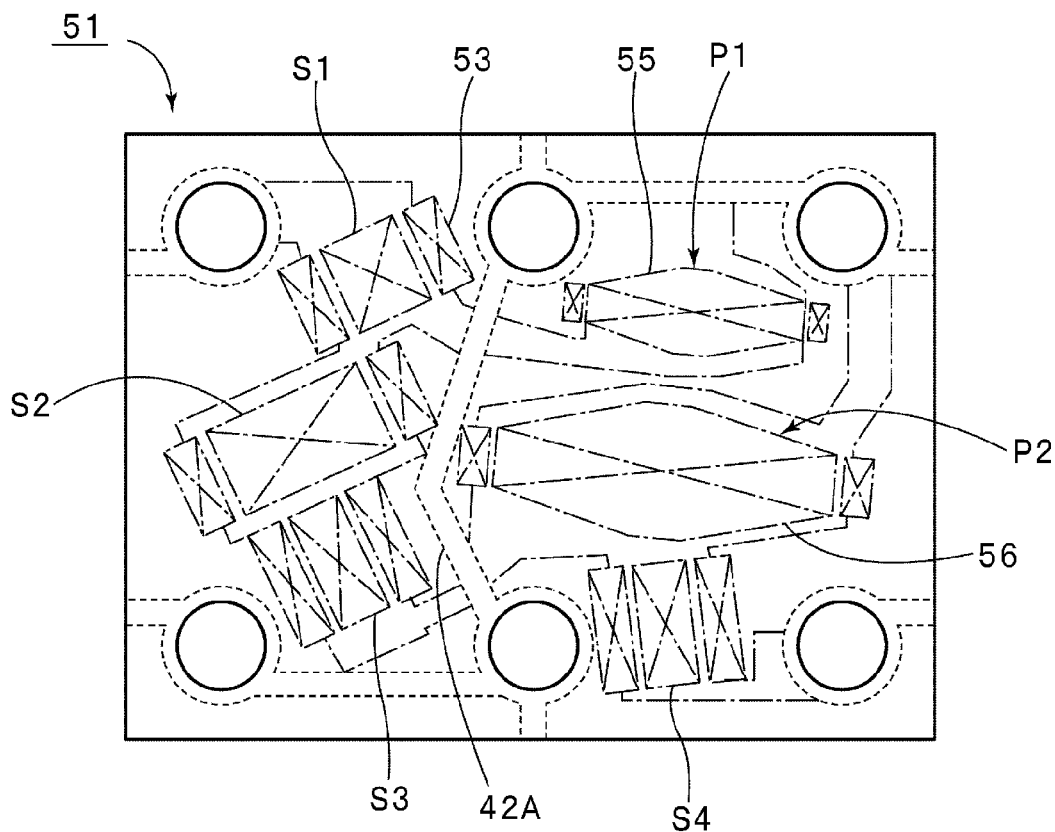
FIG. 9 is a schematic plan view of an elastic wave device according to a modification of the elastic wave device according to a preferred embodiment of the present invention.

FIG. 9 is a schematic plan view of modification of an elastic wave device according to a preferred embodiment of the present invention. Herein, an electrode structure 53 indicated by alternate long and short dash lines is provided on a piezoelectric substrate in an elastic wave device 51. This electrode structure 53 includes a ladder filter device including a plurality of series arm resonators S1 to S4 and a plurality of parallel arm resonators P1 and P2. Each of the series arm resonators S1 to S4 and the parallel arm resonators P1 and P2 preferably includes a one-port elastic wave resonator including an IDT electrode and grating reflectors disposed at either side of the IDT electrode. Moreover, a second wiring portion 42A indicated by broken lines is provided on a first insulating film. The remaining structure of the modification according to a preferred embodiment of the present invention other than these structural features is substantially the same as those in the first preferred embodiment.

However, the IDT electrodes 55 and 56 in the parallel arm resonators P1 and P2, respectively, are preferably weighted by apodization. Each of the series arm resonators S1 to S4 preferably includes a normal IDT electrode and a pair of reflectors.

Figure 10:
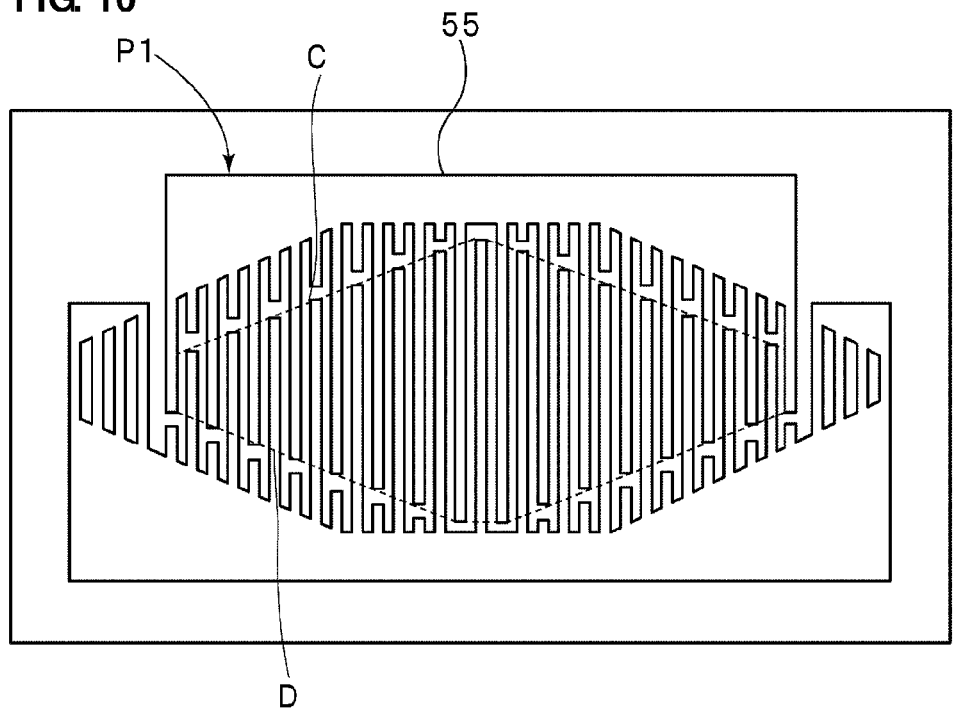
FIG. 10 is a plan view of an IDT electrode weighted by apodization used in the modification shown in FIG. 9.

The IDT electrode 55 weighted by apodization will now be described in detail with reference to FIG. 10 in which the electrode is enlarged.

In this modification, the IDT electrode 55 is preferably weighted by apodization such that the length of the interdigitated electrode fingers is the greatest in a central portion in a direction along which elastic waves propagate, and reduces as the locations of the electrode fingers get closer to both ends of the electrode. The IDT electrode according to a preferred embodiment of the present invention can be weighted by apodization in this manner. In this case, the configuration of the apodization weighting can be changed as appropriate in accordance with the intended frequency characteristics.

As in the first preferred embodiment of the present invention, the second wiring portion 42A provided on the first insulating film does not overlap with the IDT electrodes of the series arm resonators S1 to S4 and those of the parallel arm resonators P1 and P2 in this modification. That is, the IDT electrodes of the series arm resonators S1 to S4 and those of the parallel arm resonators P1 and P2 are not located under the second wiring portion 42A provided on the first insulating film in the elastic wave device 51 according to this modification. This minimizes or prevents excitation of unwanted waves, such as bulk waves, and as a result, produces excellent resonance characteristics and filter characteristics. Although the second wiring portion 42A is preferably arranged so as to avoid portions at which the IDT electrodes are located in FIG. 9, the second wiring portion 42A can be located over areas except for the electrode finger interdigitated portion of the IDT electrode 55 weighted by apodization as shown in FIG. 11.

Figure 11:
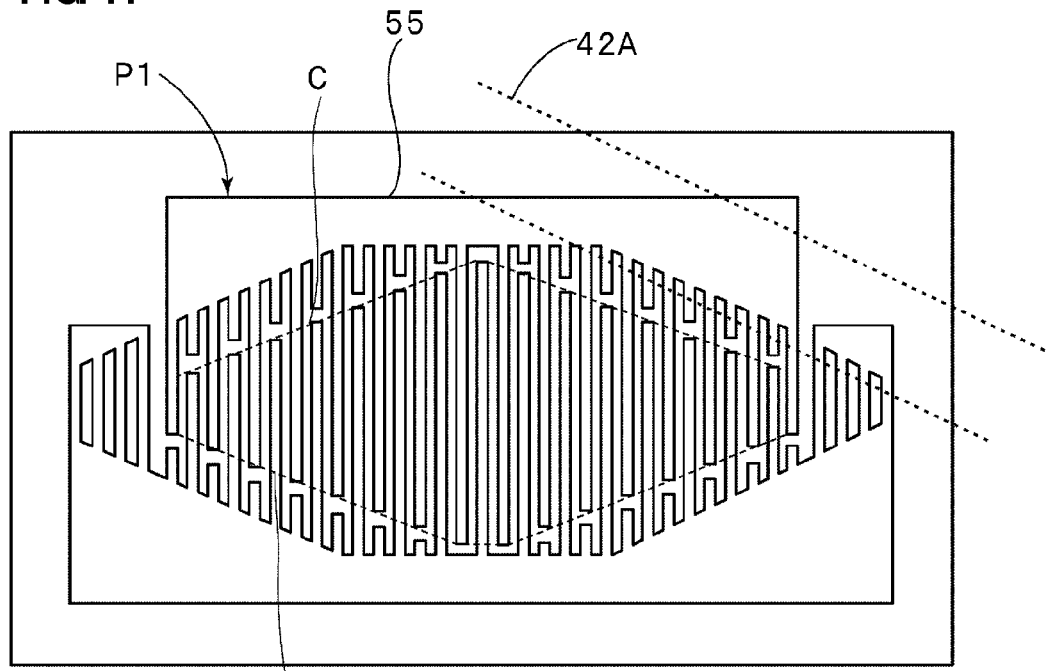
FIG. 11 is a schematic plan view illustrating another modification of the elastic wave device according to a preferred embodiment of the present invention.

As shown in FIG. 11, the area enclosed by envelopes C and D corresponds to the electrode finger interdigitated portion in the IDT electrode 55 weighted by apodization. The electrode finger interdigitated portion refers to an area in which the electrode fingers defining the IDT electrode are interposed between each other, and elastic waves are excited at this area. The electrode fingers defining the IDT electrode are not interposed between each other at areas outside the envelopes C and D, and elastic waves are not excited at these areas. Even when the second wiring portion 42A is located over the areas outside the envelopes C and D, unwanted waves, such as bulk waves, are not generated, and cause little or no adverse effect. Therefore, as in the first preferred embodiment and the above-described modification, spurious frequency components caused by unwanted waves, such as bulk waves, generated by the existence of the second wiring portion are minimized or prevented.

That is, according to preferred embodiments of the present invention, the second wiring portion provided on the first insulating film is preferably arranged over the areas other than the electrode finger interdigitated portions of the IDT electrodes. With this arrangement, the generation of unwanted waves, such as bulk waves, is minimized or prevented, and spurious frequency components are effectively minimized or prevented.

Therefore, the second wiring portion may be arranged over the bus bars of the IDT electrodes.

Although elastic boundary wave devices were described in the first preferred embodiment and the modification, preferred embodiments of the present invention may also be applied to surface acoustic wave devices including a first insulating film that is laminated on a piezoelectric substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave device comprising:
   a piezoelectric substrate;
   at least one IDT electrode provided on the piezoelectric substrate;
   a first wiring portion electrically connected to the at least one IDT electrode and provided on the piezoelectric substrate;
   a first insulating film composed of one of $SiO_2$ and SiN, provided on the piezoelectric substrate, and arranged so as to cover the at least one IDT electrode and the first wiring portion and including at least one through-hole arranged so as to partially expose the first wiring portion therethrough;
   a second insulating film provided on the first insulating film; and
   a second wiring portion arranged on the first insulating film so as to extend into the at least one through-hole of the first insulating film and to be electrically connected to the first wiring portion inside the at least one through-holes; wherein
   the second insulating film is arranged over all portions of the piezoelectric substrate where the at least one IDT electrode is disposed, and the second wiring portion is arranged over a portion of the piezoelectric substrate other than all portions of the piezoelectric substrate where the at least one IDT electrode is disposed.

2. The elastic wave device according to claim 1, wherein the elastic wave device is an elastic boundary wave device using elastic boundary waves that propagate through an interface between the piezoelectric substrate and the first insulating film.

3. An elastic wave device comprising:
   a piezoelectric substrate;
   at least one IDT electrode provided on the piezoelectric substrate;
   a first wiring portion electrically connected to the at least one IDT electrode and provided on the piezoelectric substrate;
   a first insulating film composed of one of $SiO_2$ and SiN, provided on the piezoelectric substrate, and arranged so as to cover the at least one IDT electrode and the first wiring portion and including at least one through-hole arranged so as to partially expose the first wiring portion therethrough;
   a second insulating film provided in the first insulating film; and
   a second wiring portion arranged on the first insulating film so as to extend into the at least one through-hole of the first insulating film and to be electrically connected to the first wiring portion inside the at least one through-holes; wherein
   the second insulating film is arranged over all portions of the piezoelectric substrate where the at least one IDT electrode is disposed, and the second wiring portion is arranged over a portion of the piezoelectric substrate other than all portions of the piezoelectric substrate where an electrode finger interdigitated portion of the at least one IDT electrode is disposed.

4. The elastic wave device according to claim 3, wherein the elastic wave device is an elastic boundary wave device using elastic boundary waves that propagate through an interface between the piezoelectric substrate and the first insulating film.

* * * * *